Feb. 23, 1965 H. W. A. GERLACH 3,171,086

TRAVELING WAVE AMPLIFIER AND OSCILLATOR WITH TUNNEL DIODES

Filed Sept. 10, 1962 2 Sheets-Sheet 1

INVENTOR,
HORST W. A. GERLACH

BY S. J. Rotondi; A. J. Rupert & J. R. Edgerton
ATTORNEY

TRAVELING WAVE AMPLIFIER AND OSCILLATOR WITH TUNNEL DIODES

Filed Sept. 10, 1962 2 Sheets-Sheet 2

Inventor,
Horst W. A. Gerlach
By: S. J. Rotondi, A. J. Dupont & J. P. Edgerton

United States Patent Office 3,171,086
Patented Feb. 23, 1965

3,171,086

TRAVELING WAVE AMPLIFIER AND OSCILLATOR WITH TUNNEL DIODES

Horst W. A. Gerlach, Bethesda, Md., assignor to the United States of America as represented by the Secretary of the Army Filed Sept. 10, 1962, Ser. No. 222,744
9 Claims. (Cl. 330—43)
(Granted under Title 35, U.S. Code (1952), sec. 266)

The invention described herein may be manufactured and used by or for the Government of the United States of America for governmental purposes without the payment to me of any royalty thereon.

This invention relates to traveling wave devices, and more particularly to a traveling wave device employing negative resistance diodes.

Conventional traveling wave beam devices employ high voltage electron beams as a source of energy. The electron beams pass in close proximity to a slow wave structure and when the phase velocity of an electromagnetic wave traveling in the slow wave structure is approximately equal to the electron velocity, energy is coupled from the electron beam to the electromagnetic wave. In order to obtain reasonable efficiency and good performance with such devices, it is necessary that the electron beam pass closely along the slow wave structure. The electron beam requires elaborate focusing, and careful alignment of the components. Also, of course, the entire device has to be enclosed in an evacuated envelope, and if it is exposed to severe environmental conditions, costly special designs must be made.

It is an object of this invention to provide a novel traveling wave device which is simple, compact, rugged and light weight.

Another object of this invention is to provide a novel traveling wave device utilizing the characteristics of tunnel diodes.

A further object of this invention is to provide a tunnel diode traveling wave device capable of high power output.

A still further object of this invention is to provide a negative resistance traveling wave device whose frequency may be varied.

These and other objects of this invention are accomplished by incorporating in a periodic slow wave structure, a high-frequency negative-resistance two-terminal device which serves as the energy pump for the slow wave structure.

The specific nature of the invention, as well as other objects, uses and advantages thereof will clearly appear from the following description and from the accompanying drawings where like reference numerals are used for like parts throughout, and in which.

Figures 5, 6A, 6B, 7A, 7B:
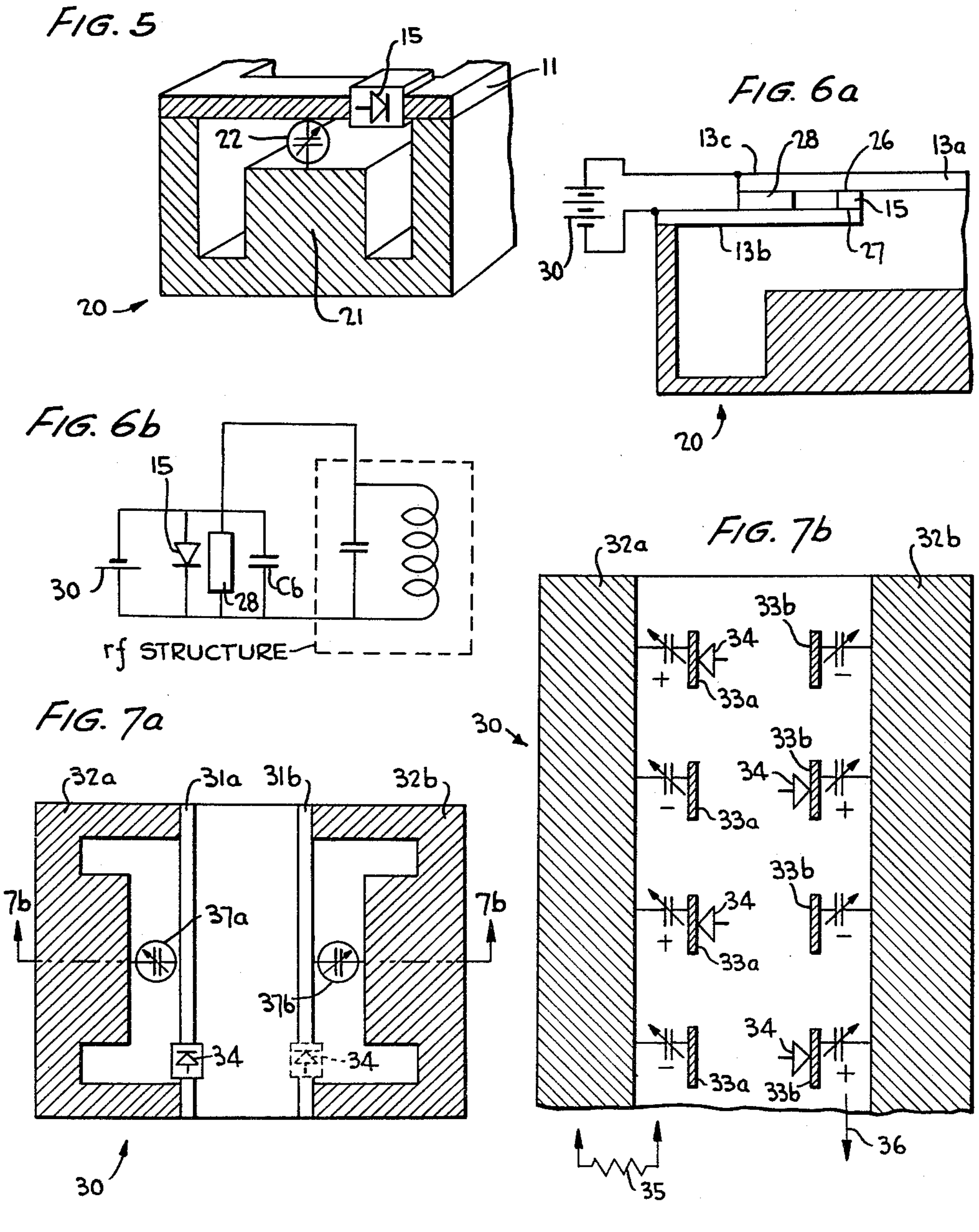
FIG. 5 is an embodiment of a variable frequency traveling wave amplifier constructed in accordance with the teachings of this invention.

FIG. 6*a* is one embodiment of a biasing and mounting scheme for the tunnel diode used in this invention.

FIG. 6*b* is an equivalent circuit diagram of the diode mount.

FIG. 7*a* is an end view, partially in section, of one embodiment of an oscillator constructed in accordance with the teaching of this invention.

FIG. 7*b* is a sectional view of the oscillator of FIG. 7*a*.

Figures 1, 2, 3:
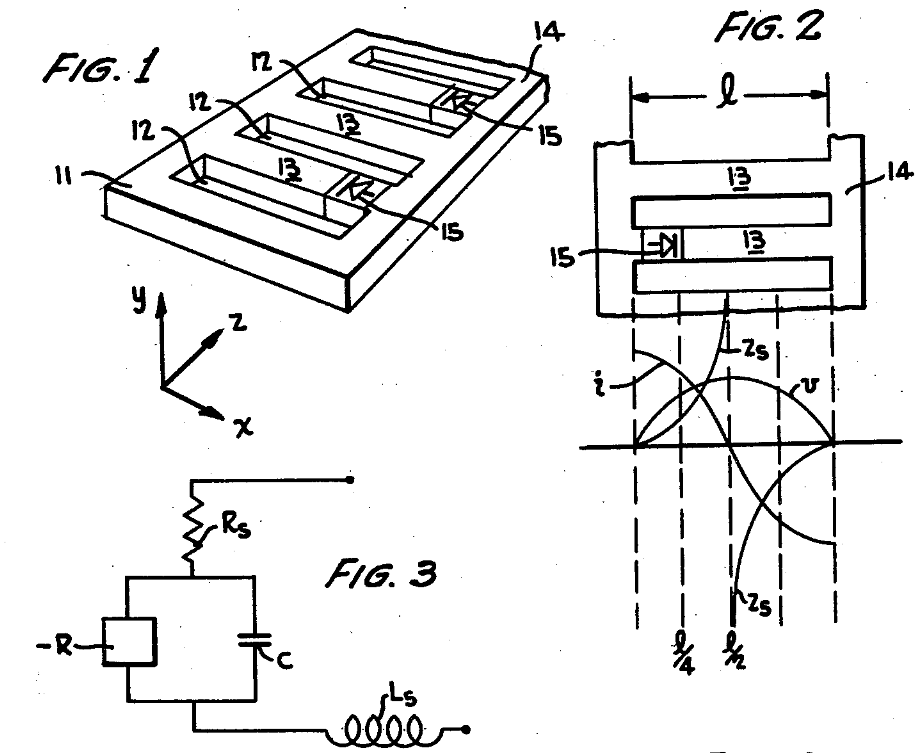
FIG. 1 is a drawing, partially schematic, of a ladder line amplifier.
FIG. 2 is a diagram of the voltage, current, and impedance variations existing in a cell of the ladder line of FIG. 1.
FIG. 3 is an equivalent circuit diagram of a tunnel diode.

Referring to FIG. 1, there is shown a periodic slow wave structure represented by ladder line 11. Ladder line 11 is made up of a series of slots 12 and rungs 13 in a conducting plane 14. Electromagnetic waves will propagate with a phase velocity smaller than the velocity of light among the ladder in a longitudinal ($z$) direction with electromagnetic energy progressing from slot to slot. Electric field lines are directed from one rung to another, very close to the plane of the ladder, decaying exponentially away from the plane and varying sinusoidally from one end of the slot to the other. The R-F currents will flow along the rungs and around the ends of the slots.

Tunnel diodes 15 are placed in the rungs 13 of the ladder line 11. These tunnel diodes 15 are biased into their forward negative resistance region and serve as "energy pumps" transferring energy into the electromagnetic wave being propagated along the slow wave structure 11. The tunnel diodes 15 are so situated in the rungs 13 that the impedanec of the tunnel diodes are properly matched to the impedance of the cell to insure stable operation.

The mechanism of operation, and the considerations affecting the diode placement in the rungs will be explained in connection with FIGS. 2, 3, and 4.

The ladder line 11 has the propagation properties of a filter structure, i.e. there is a certain passband of the fundamental available for power transmission. The frequency range of a ladder line in association with a ridge waveguide extends usually from the cut-off frequency of the wave-guide up to the resonance of the slot or rung length. The frequency for slot resonance depends on the geometry of the slots. The resonant frequency for the rectangular slots 12 is that frequency where the slot length (the $x$ dimension of FIG. 1) is equal to one-half of the free space wave length. The operating frequency for the traveling wave amplifier of this invention is below the resonance frequency of the slots 12, since the "slot" resonator is capacitively loaded by the diode, etc.

FIG. 2 shows, in principle, the variation of electric field E, conduction current $i$, and R-F impedance $Z_s$, with the length of slots 12. As shown, the electrical field E, and the conduction current $i$ have sinusoidal variation with the length, whereas the impedance $Z_s$ varies as function of the tangent.

If $Z_0$ is the characteristic impedance of the slot 12 looking from the left end of FIG. 2, the expression for the impedance $Z_s$, disregarding losses, is: $Z_s=Z_0 \tan (2\pi 1\lambda)$, where $\lambda$ is the free space wave length of the propagating signal along the slot ($x$-direction). However, the wave experiences total reflection at the end of the slot and a standing wave pattern in the slot is set up. To insure stable operation of the amplifier, the tunnel diodes 15 are placed at points on the rungs 13 where the characteristic impedance of the tunnel diode $Z_{TD}$ approximately equals the slot impedance, $Z_s$.

The matching of the tunnel diode impedance may be more readily appreciated from a consideration of the equivalent circuit diagram of the tunnel diode, shown in FIG. 3. The tunnel diode is a two terminal element which exhibits a negative resistance characteristic at a small forward bias voltage. The diode itself consists of a p-n junction formed by heavily doped regions of the semiconductor.

The electrical characteristics of the tunnel diode are derived from the propagation of electron waves across the space charge layer of the p-n junction. This layer is generally thinner than 100 A., and since the propagation of these waves takes place with nearly the speed of light, the high frequency response is essentially limited by a junction capacity which exists across the space charge layer of the junction. The high frequency performance depends, therefore, upon the impedance matching of the tunnel diode to the circuit.

As shown in FIG. 3 the equivalent circuit for the tunnel diode consists of the negative resistance —R, the shunt junction capacity C, a series resistance $R_s$ which includes the ohmic losses of the leads and the semiconductor material itself, and the lead inductance $L_s$. Typically, a tunnel diode has a junction capacity on the order of 2 $\mu$f./cm.$^2$ and a current density excess of 10,000 amps/cm.$^2$. The tunnel diode is a current controlled device at low voltages, and inherent with it, is a low impedance. This means that, for proper matching, the diode must be mounted at a low-impedance point of the slow wave structure.

The maximum power which can be obtained from a single diode is limited by the current capability and the maximum voltage swing. The permissible biasing voltage cannot be exceeded because the conditions for the valence and conduction band of the semiconductor are not satisfied. The power output can only be increased by enlarging the magnitude of the peak current. The current capability of the tunnel diode can be magnified by enlarging the cross-section of the junction, which also means the junction capacity C is increased. In the cascaded amplifier of FIG. 1 the total power output of the amplifier is limited by the current capability of the last diode. If the diode junction cross-section is made larger, its impedance will correspondingly decrease, and succeeding diodes following the input will be mounted at succeedingly lower impedance points of the structure.

Figure 4:
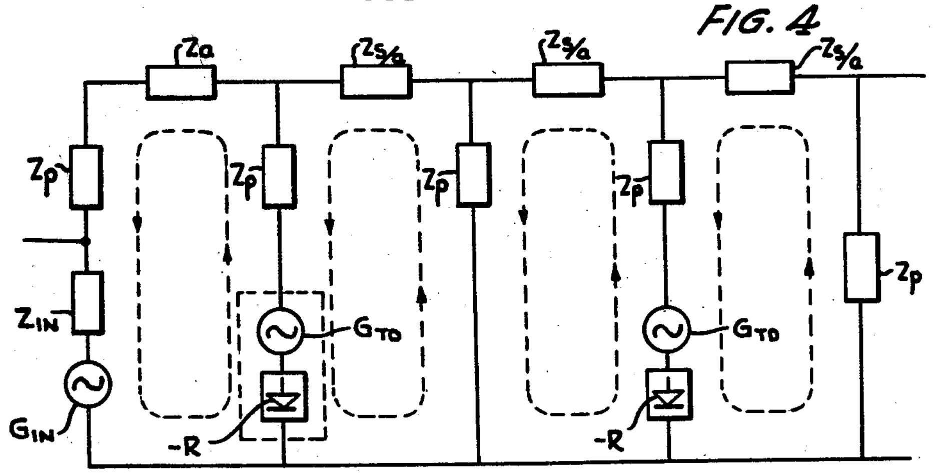
FIG. 4 is an equivalent circuit diagram of the traveling wave amplifier of FIG. 1.

The principle of the device shown in FIG. 1 may be seen with reference to the equivalent circuit diagram of FIG. 4. Each resonant cell of the ladder line 11 can be represented by a $\pi$-section having a series impedance $Z_s$ and a parallel impedance $Z_p$. The tunnel diode constitutes a current generator, and since it is a "negative resistance" energy source and adds energy to the circuit, in a distributing manner, rather than absorbing energy from it, amplification is achieved.

If one matches the signal source to the device input and the output to the external load maximum power transmission is obtained. The device can be interpreted as a traveling wave amplifier, having a growing signal in the direction of the propagation as long as the negative resistance (—R) exceeds the losses of the transmission line. As pictured in FIG. 4 the output of each tunnel diode is tightly coupled to its resonance cell, and the effect of each diode is cumulative, provided that the circulating current in the RF circuit does not exceed the peak current of the succeeding diode.

FIG. 5 is a preferred embodiment of an amplifier of this invention, which is tunable over an appreciable frequency range. The amplifier shown in FIG. 5 is a ladder line amplifier 11, similar to that shown in FIG. 1, in association with a ridge wave guide 20. The operation of this amplifier combination is similar to that described in connection with FIG. 1. By loading the ladder line 11 by the introduction of the ridge capacity of the ridge wave guide 20 the resonant frequency of the ladder structure may be changed. The tighter the coupling between the ladder line 11 and the ridge 21 the lower the cutoff frequency at lower end of the band. In order to obtain a tunable amplifier, a variable impedance is situated between the rungs of the ladder 11 and the ridge 21. The variable impedance may consist either of a screwlike plunger or preferably a voltage variable capacitor (varactor), for ease of tuning, and will normally be located at the point of maximum R-F potential on a rung 13.

FIGS. 6*a* and 6*b* show one biasing and mounting scheme for the tunnel diodes used in accordance with the teachings of this invention. Similarly to FIG. 5, there is represented a ladder line having rungs 13 in combination with a ridge wave guide 20. The rung 13 shown in detail is made up of three portions **13*a*, 13*b*, and 13*c*. The tunnel diode, which may be shaped like a pill box, is bonded at 26 and 27 between the portions of the rungs 13*a* and 13*b*. A portion of the rung 13*a* extends beyond the tunnel diode 15 overlapping the portion of the rung 13*b*. This extension is labeled 13*c*. Filling the space between 13*b* and 13*c* up to the end of a slot in the ladder line shown at 27 is a piece of resistive material 28. To minimize inductance, resistive material 28 may be a thin slice of germanium. The bias for the tunnel diode 15 is supplied by a suitable source 30, represented here by a battery. The source 30 (V bias) is connected to 13*b* and 13*c***.

The overlap of portions **13*b* and 13*c*** provide a capacitive reactance, which forms an R-F short circuit (or by-pass capacitor C*b*) in parallel with the source 30 and the tunnel diode 15, isolating the source 30 from the R-F circuit. The resistive material 28 is D.C.-wise in parallel with the source 30 and the tunnel diode 15 including the R-F circuit or structure. FIG. 6*b* is an equivalent circuit diagram of the mounting and biasing arrangement described.

The traveling wave devices as described can, of course, be used as high frequency oscillators by providing the amplifier either with an external or an internal feedback. External feedback can be accomplished by a number of well known means, but oscillators constructed in this manner tend to be frequency dependent.

In FIGS. 7*a* and 7*b* there is shown a traveling wave oscillator 30 employing internal feedback, whose frequency may be varied within a wide range. The oscillator shown in FIG. 7 may be visualized as an amplifier, such as shown in FIG. 5, folded so that the input "sees" the output.

The oscillator 30 comprises a pair of opposed ladder line amplifiers **31*a* and 31*b*, having incorporated therein, tunnel diodes 34. Each ladder line is similar to that described in connection with FIG. 1. Connected to each ladder line 31 is a ridged wave guide structure 32*a* and 32*b***. The entire structure forms essentially two opposed amplifiers of the types described in connection with FIG. 5.

Each of the ladder lines **31*a* and 31*b* have rungs 33*a* and 33*b*** as shown in FIG. 7*b*. Tunnel diodes 34, shown schematically, are located at the proper impedance points in the rung structure. One side of the oscillator 30 is terminated in the characteristic impedance of the structure as represented at 35, and the output is taken from 36. The rungs **33*a* and 33*b*** are so arranged that opposing rungs will be 180° out of phase as indicated by the + and — signs in FIG. 7*b*.

The proximity of the two ladder lines **31*a* and 31*b*** to each other, which are mutually coupled to one another, determines the amount of feedback. Since opposing rungs are 180° out of phase, the device will sustain self-excited oscillations. As in the case of the amplifier, the output of the oscillator is dependent on the current capability of the tunnel diodes.

The frequency of the oscillator 30 may be varied by providing a variable impedance, such as varactors **37*a* and 37*b* between the rungs 33 and the ridge 32**. The frequency range of the oscillator is determined by the amount by which the variable impedance may be varied.

It will be apparent that the embodiment shown is only exemplary and that various modifications can be made in construction and arrangement within the scope of the invention as defined in the appended claims.

I claim as my invention:

1. A traveling wave amplifier comprising:

(*a*) a slow wave structure having a series of rungs and slots, said rungs and slots forming a series of resonant cells, (*b*) negative impedance means, (*c*) said negative impedance means connected in said rungs of said slow wave structure.

2. A traveling wave amplifier as in claim 1 wherein:
(a) said negative impedance means are tunnel diodes.

3. A traveling wave device comprising:
(a) a slow wave structure having a series of rungs and slots, said rungs and slots forming a series of resonant cells, said cells having an impedance which varies from a high impedance at the center of said slot to a low impedance at the end of said slot,
(b) tunnel diode means, said tunnel diode means having a characteristic impedance,
(c) said tunnel diode means connected to said rungs of said slow wave structure at a location where the impedance of said resonant cells are matched to the impedance of said tunnel diodes to provide stable operation.

4. A traveling wave device as in claim 3 wherein:
(a) said tunnel diode means have increased current capacity from one resonant cell to the next.

5. A traveling wave device comprising:
(a) a slow wave structure having a series of rungs and slots, said rungs and slots forming a series of resonant cells,
(b) a ridge wave guide coupled to said slow wave structure,
(c) tunnel diode means connected to said slow wave structure,
(d) means to vary the resonant frequency of said cells connected between said slow wave structure and said ridge wave guide.

6. A traveling wave device as in claim 5 wherein:
(a) said means to vary is a voltage variable capacitor.

7. A traveling wave device comprising:
(a) a slow wave structure having a series of rungs and slots, said rungs and slots forming a series of resonant cells, (b) said rungs having overlapping portions,
(c) tunnel diode means, said tunnel diode means connected between said overlapping rung portions.

8. A microwave oscillator comprising:
(a) two slow wave structures, each of said structures having a plurality of rungs and slots forming a series of resonant cells,
(b) said slow wave structures located in close proximity to one another such that energy from one structure is coupled to the other,
(c) said cells of one structure being in phase opposition to corresponding cells of said other structure,
(d) tunnel diode means connected to the rungs of said cells.

9. A microwave oscillator as in claim 8 wherein:
(a) a ridge wave guide is associated to each of said slow wave structures, and
(b) variable impedance means are connected between said resonant cells and said ridge wave guide to vary the impedance of said resonant cells.

References Cited by the Examiner

UNITED STATES PATENTS

| | | | |
|---|---|---|---|
| 2,586,895 | 2/52 | Willoughby | 343—770 X |
| 2,760,161 | 8/56 | Cutler | 330—43 X |
| 3,098,973 | 7/63 | Wickersham et al. | 343—701 X |

OTHER REFERENCES

Hines: Article, "High-Frequency Negative-Resistance Circuit Principles for Esaki Diode Applications," The Bell System Technical Journal, May 1960, pages 477–513, specific pages 484–488; 490–510, 331–107.

ROY LAKE, *Primary Examiner.*

NATHAN KAUFMAN, *Examiner.*